(12) United States Patent
Buard et al.

(10) Patent No.: US 9,213,614 B2
(45) Date of Patent: Dec. 15, 2015

(54) METHOD FOR TESTING A SOFTWARE APPLICATION

(75) Inventors: Nadine Buard, Meudon (FR); Florent Miller, Levallois (FR); Antonin Bougerol, Suresnes (FR); Patrick Heins, Castlenau de Montmiral (FR); Thierry Carriere, Triel sur Seine (FR)

(73) Assignee: European Aernautic Defence And Space Company Eads France, Paris (FR)

( * ) Notice: Subject to any disclaimer, the term of this patent is extended or adjusted under 35 U.S.C. 154(b) by 687 days.

(21) Appl. No.: 12/669,867

(22) PCT Filed: Jun. 26, 2008

(86) PCT No.: PCT/FR2008/051166
§ 371 (c)(1),
(2), (4) Date: Jun. 8, 2010

(87) PCT Pub. No.: WO2009/013419
PCT Pub. Date: Jan. 29, 2009

(65) Prior Publication Data
US 2010/0280785 A1  Nov. 4, 2010

(30) Foreign Application Priority Data

Jul. 23, 2007  (FR) ..................................... 07 56687

(51) Int. Cl.
*G01R 31/00* (2006.01)
*G06F 11/24* (2006.01)
*G01R 31/305* (2006.01)
*G01R 31/302* (2006.01)
*G01R 31/28* (2006.01)
*G01R 31/311* (2006.01)

(52) U.S. Cl.
CPC ............ *G06F 11/24* (2013.01); *G01R 31/2849* (2013.01); *G01R 31/302* (2013.01); *G01R 31/305* (2013.01); *G01R 31/311* (2013.01)

(58) Field of Classification Search
USPC ......... 702/40, 57, 58, 83, 117, 120, 182, 185; 714/E11.008
See application file for complete search history.

(56) References Cited

U.S. PATENT DOCUMENTS

| 4,786,865 | A | * | 11/1988 | Arimura et al. .......... 324/754.23 |
| 5,270,643 | A | * | 12/1993 | Richardson et al. ..... 324/754.22 |
| 6,842,021 | B1 | | 1/2005 | Weaver |
| 6,967,491 | B2 | * | 11/2005 | Perdu et al. ............... 324/754.23 |
| 7,375,332 | B1 | * | 5/2008 | Horn .......................... 250/338.4 |
| 2002/0199175 | A1 | * | 12/2002 | Saulsbury ..................... 717/141 |
| 2005/0006602 | A1 | * | 1/2005 | Perdu et al. ............... 250/492.22 |
| 2009/0115440 | A1 | * | 5/2009 | Bergmann .................... 324/757 |

FOREIGN PATENT DOCUMENTS

WO   WO 2005/008850   1/2005

OTHER PUBLICATIONS

International Search Repot dated Dec. 19, 2008.

* cited by examiner

*Primary Examiner* — Paul D Lee
(74) *Attorney, Agent, or Firm* — RatnerPrestia

(57) ABSTRACT

To test a software application, a method submits an electronic board including a component implementing an application to a laser radiation generated in test equipment. The component is excited with laser pulses having very short durations distributed during complex operational phases of the component for running the application, and the reaction of the component and the application are observed.

11 Claims, 2 Drawing Sheets

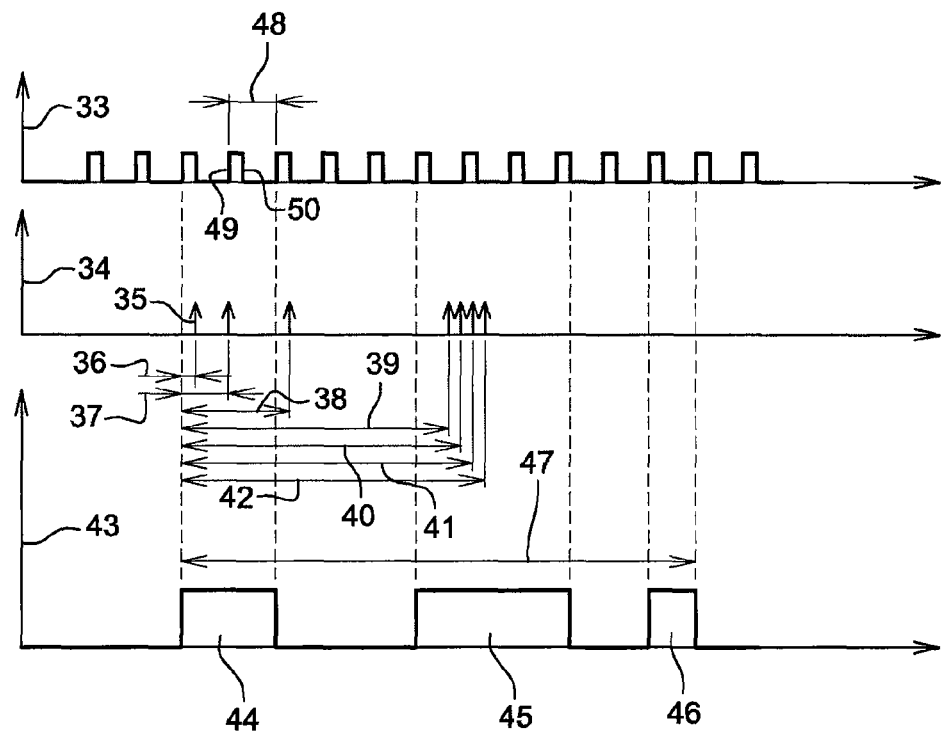
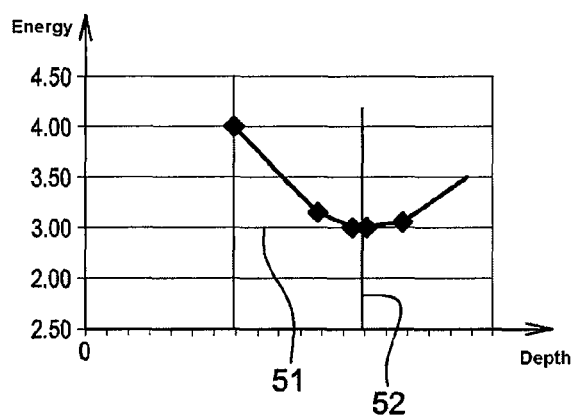
Fig. 2
Fig. 3

METHOD FOR TESTING A SOFTWARE APPLICATION

This application claims priority of PCT International Application No. PCT/FR2008/051166 filed on Jun. 26, 2008. The contents of which are incorporated herein by reference.

FIELD OF THE INVENTION

This invention relates to a method for testing a software application. It can be used to test electronic boards and for any application implemented by such boards. The electronic boards targeted by this invention are mainly those subjected to external energy interactions. The term software application refers to a digital or analogue processing operation for input data to produce output data. The input data can be in the form of measurements originating from a measuring element or electrical states of such an element, mounted or not onto the board. The output data is either the same type of data as the input data, having been corrected or transformed, data attributes of this data, or actuator controls driven by the electronic board. An electronic board differs from an electronic component in the sense that it can include a set of electronic components used by the logistics for maintaining in operation a main component mounted onto the board. An electronic board is essentially comprised of a connector or connection device enabling the board to be connected inside an apparatus.

BACKGROUND

The correct operation of the electronic components, typically of the integrated electronic circuits, can be disturbed by the environment in which they exist, for example a natural or artificial radiation environment or an electromagnetic environment. External aggressions create eddy currents by interacting with the component's constituent material. These currents can cause a transient or permanent malfunction of the component and the application used by it.

For a natural radiation environment, these effects, generically known as single event effects, are created by particles. For example, heavy ions and protons in space affect the electronic equipment of satellites and launch vehicles. At lower altitudes, where aeroplanes circulate, the presence of neutrons is noted, which also create single event effects. On the ground, such aggressions can also be found and affect electronic components, whether this is due to particles from the natural environment, radioactive particles present in the casings, problems related to immunity, signal integrity, thermal instabilities and methods. In the following paragraphs, the effects originating from particles will be considered in more detail, however the invention also applies to the same types of effects created by different and varied environments.

In a general manner, different types of single event effects can be distinguished:

transient faults: a transient current created by ionisation causes either a transient current which spreads over the circuit, or a change of one or several electrical states (for the case of a memory or registry). In the previous example, the effect is described as transient as, if the content of the memory or registry is rewritten, the error disappears;

permanent faults requiring an intervention which was not provided for within the normal operating conditions of the application, for example reconfiguring the software or performing an intervention on the power supply (shutdown then restart). Following this intervention, the component operates correctly;

destructive effects leading to the definitive shutdown of the component.

All of these faults produced in the component do not have an immediate or delayed effect on the application, as the different resources of the component are not necessarily used or solicited at the same time. There is therefore a problem in determining whether a fault produced in the component has a harmful effect on a software application driven by this component, mounted onto an electronic board, or whether the latter is able to overcome this.

In addition, the equipment or system architecture can offer a certain level of protection. The integrated applications therefore include a certain level of tolerance to faults which should be quantified. This quantification is not yet available at this time.

A certain number of methods and techniques regarding equipment, operating systems and application software enable an integrated application to be protected with regards to transient and permanent faults. These are called mitigation techniques. The invention relates more specifically to a method enabling application fault tolerance and mitigation techniques regarding the transient and permanent effects which affect logic and analogue electronic components to be assessed and validated.

An electronic component can be made up of, among other examples, a user memory area, a memory area required for its configuration, software resources enabling operations to be performed, resources required for communication between the different logic blocks and resources required for communication between this component and its environment.

The applications based on logic or analogue components have a certain level of tolerance to faults, that is to say that some faults created in the silicon will not have any visible consequences on the application. For example, in the event of a change in the state of a memory cell, if this cell is not used by the application before being rewritten, no error will be produced in the application. In this event, there is therefore an important difference between testing a component, which thus reveals a malfunction, and testing an application, which, under the same conditions, does not malfunction.

Similarly in combinatory logic (for example at the heart of a microprocessor), an eddy current can spread over a series of logic gates and subside and disappear without ever being stored in a registry. However, if all of the applications have a certain level of tolerance to faults, the designer faces the problem of quantifying this tolerance level so as to apply an accurate level of mitigation.

Numerous mitigation methods can be implemented so as to limit, prevent, detect and/or correct the effects which can cause transient faults and permanent faults to the application.

Some methods are thus known, aiming at detecting and/or correcting the faults which can appear in logic circuits so as to prevent failures occurring in the application using the component. Error correction codes can be quoted as an example of this, which enable one or several errors to be detected and corrected. The most complex error correction codes can detect and correct several errors simultaneously. Other mitigation techniques include the periodic rewriting of data or the periodic verification of data susceptible of being corrupted and followed by the rewriting of this data if an error is detected.

There are also methods concerning the board, equipment or system, which will not correct or detect a fault, but prevent it from causing system failures. Redundancy methods can be quoted as an example of this, (this more often refers to triplication) with the voting system. These methods are based on redundancy, either physical redundancy regarding the number of circuits produced, or temporal redundancy, of all or part of the resources performing the application operations. A voting system, positioned upstream and on the supposition that an error appears at the level of one of the duplicated resources, prevents an error from having a consequence on the operation performed by the component or the board.

Multiple errors are also possible and are becoming more and more frequent in new memory technologies. Correcting these errors requires error correction codes to be much further developed (Reed Solomon type error correction codes), which are detrimental to application performance. When possible, methods for physically separating resources are implemented so as to prevent an event from modifying two physically close resources at the same time. Nevertheless, this separation requires perfect knowledge of the logic architecture of the component, which is not always available for the designer.

Finally, the component aside, mitigations can be installed at the level of the operating system, the application software, the electronic equipment architecture and at the upper level of the overall system architecture.

All of the methods previously described can be coupled in such a way as to optimise the level of protection of the component and/or of the operation that it performs.

Nevertheless, the installation of all of these methods is not an easy task, as they are specific to a given component and application. They can be subjected to a production error due to their implementation complexity. In addition, their level of efficiency is not necessarily known in advance. Indeed, according to certain technological parameters and in particular to the component's logic architecture, some mitigation techniques reveal themselves to be inefficient in the event of multiple errors. Although, due to the integration of electronic components, multiple errors, due to interaction with a single particle, are becoming more and more frequent. The efficiency of mitigation techniques implemented for the component, equipment and system must thus be assessed. On the other hand, the specific use of a component by a given application can make an otherwise validated mitigation technique inefficient.

In document PCT/US2004/022531, a system is known, based on a pulsed laser focused on the surface of an electronic component for injecting faults into this electronic component and observing the reaction in its voltage and/or power supply. However, in this document, the component tested is not in the actual situation of running an application. In addition, in order to avoid subjecting the component to sustained aggression, this document provides for synchronising the aggression. Finally, to ensure detecting the effects identified above, sustained impulse times of at least more than one microsecond are provided for. The measurements are therefore not realistic.

SUMMARY OF THE INVENTION

In this invention, in order to correct this problem, the component is mounted onto a user card and is running its application. In addition, the laser radiation is focused inside the component on the areas presenting sensitivity to the injection of charges. The card is integrated or not into a piece of equipment and/or a system. The injection of faults enables the level of tolerance of the application to transient or permanent faults to be quantified either directly or after analysis, and/or the mitigation techniques implemented to protect the application with regards to the same faults to be validated. Repeating the aggressions performed by the laser over time and the short duration of these excitations enable the component's reaction to be characterised in a realistic manner when the application is running.

The invention therefore relates to a method for testing a software application implemented with an electronic component in an integrated circuit, in which
  the sensitivity of the application to faults induced by energy particles within the component in a test installation is measured when the component is in operation and running the application,
  with this test installation, the electronic component is activated and, due to this activation, the component is synchronised by a clock signal and has an application cycle time,
  operational working conditions being different from static working conditions in that the component, in operational working conditions, runs an application operation different to an internal logistic operation implemented in static working conditions,
  the electronic component thus activated is excited by pulsed laser radiation impulses produced by the test installation,
  during this test, the component inputs receive input signals, varying over time, and the component outputs correspondingly produce output signals, varying over time,
  a malfunction is measured, occurring in the application run by the activated electronic component, which corresponds to this excitation,
  this malfunction materialises in the application signals, varying over time, which are different to the expected application signals, varying over time.
  characterised in that, for this measurement,
  the component in an integrated circuit is mounted onto an electronic board capable of running the application,
  the electronic board capable of running the application is placed in the test installation,
  the excitation impulses are started by an asynchronous or synchronous signal of this clock signal of the application cycle.
  the laser radiation is focused at different depths in the component, and
  the duration of the impulses is limited to less than or equal to one nanosecond.

BRIEF DESCRIPTION OF THE DRAWINGS

The invention will be better understood after reading the following description and after examining the accompanying figures. These are presented as a rough guide and in no way as a limited guide to the invention. The figures show:

FIG. 2: A temporal diagram showing the component's clock signals, laser impulse dates of the invention and the cycle times of the application implemented;

FIG. 3: For an area of interest according to the invention, a critical energy rise, for which the interactions are critical, according to a focus depth and a choice of excitation energy.

DETAILED DESCRIPTION

Figure 1:
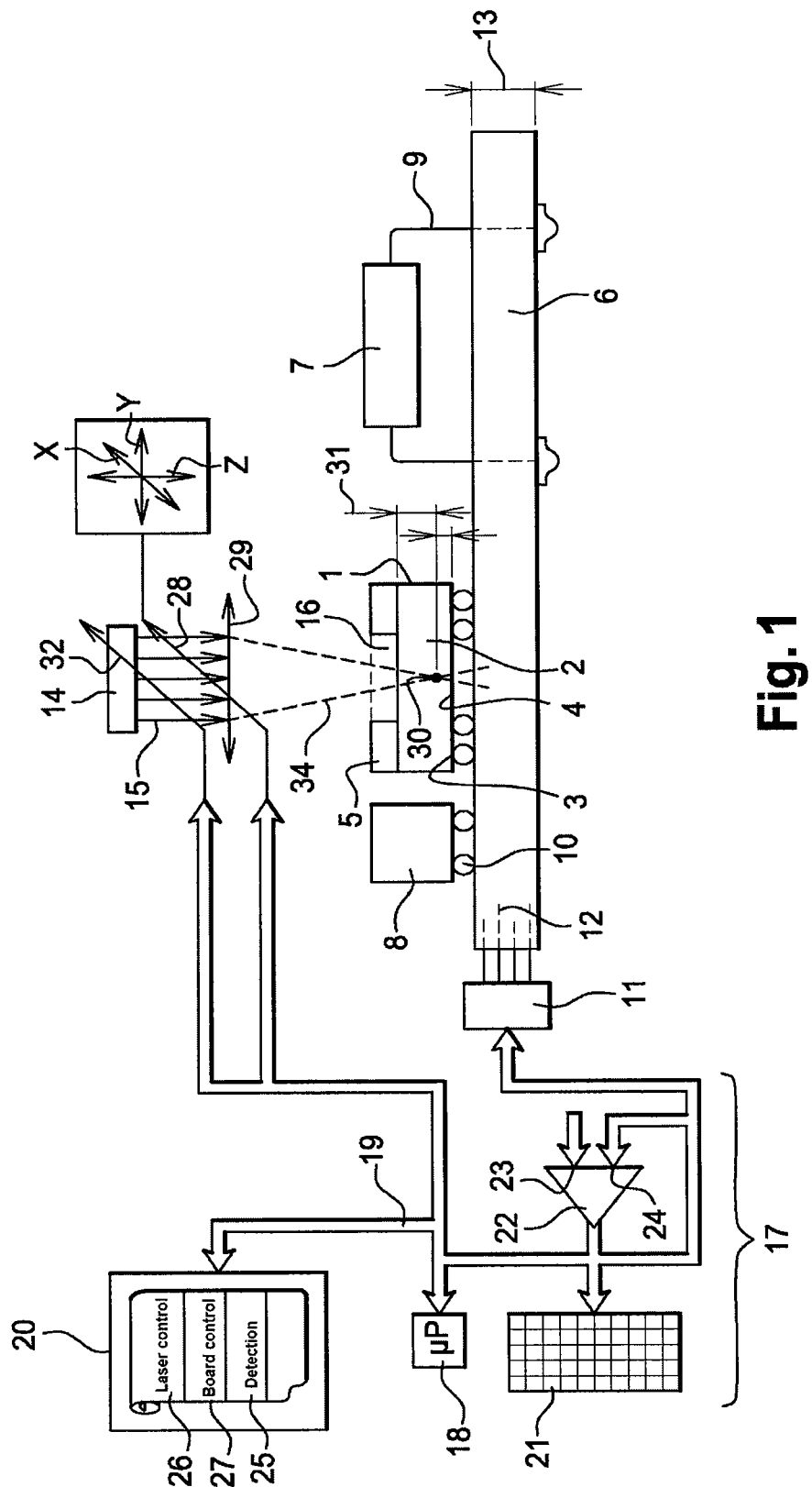
FIG. 1: A schematic representation of a device capable of being used to implement the method of the invention.

FIG. 1 shows a device capable of being used to implement the method of the invention. The purpose of the invention is to measure the effects of energy interactions within an electronic component 1. The electronic component 1 is thus comprised, in a known manner and presented upside down, of a semiconductor crystal 2 into which various introductions are made: the housings and areas introduced with impurities. Connections, typically metallic connections such as 3 open onto a connection interface 4 of the electronic component 1. The semiconductor plate 2 can be coated with a layer of protection 5, for example metallisation. The layer of protection 5 is located on the opposite side of the crystal 2 to the side where connections 3 are made.

In the invention, in order to measure the malfunctions of the application run by an electronic component 1, which would be subjected to energy interactions, this component 1 is mounted onto a monolayer or multilayer, printed circuit board-type, electronic board 6. Board 6 can be an actual user card for component 1. To this effect, board 6 is comprised of other components such as 7 and 8, pin-type connection components 9 crossing board 6 or solder ball-type components such as 10 for surface-mounted components. In the example, component 1 is a surface-mounted type component with solder balls connected to metallisations 3, but this is not a requirement.

Board 6 is fitted with components 7 and 8, which are used for its correct operation. For example, these components are clock crystal-type components, transmission filters, decoupling components, changeovers or switches, or even microcontrollers. Component 1 can be, for example, a microprocessor, with or without an integrated associated memory or a programmable logic component (FPGA).

Board 6 is fitted with a connector 11. In the invention, this connector 11 is used to connect board 6 to the test apparatus. Connector 11 is connected in the board to tracks such as 12 leading to components 1, 7 and 8. Tracks 12 can be distributed throughout the thickness 13 of the board for a multilayer-type electronic board.

In order to measure the sensitivity of component 1 and of the application to energy particles, a test apparatus is used. With this apparatus, component 1 is excited by means of a laser source 14. This laser source 14 emits a radiation 15, which aggresses electronic component 1. In order to promote this aggression, component 1 is preferably subjected to this aggression via its base 5. In order to promote this aggression, layer of protection 5 is preferably open (in particular by a chemical or mechanical process) in a window 16, through which the radiation 15 from laser 14 can penetrate.

At the time of the test, the electronic component 1 is connected via its interface 11 to a power supply and control device 17. Device 17 is comprised, in a schematic manner, of a microprocessor 18 connected by a control, address and data bus 19 to a programme memory 20, a data memory 21, interface 11, laser source 14 and a system 32 for attenuating the laser energy. Device 17 also comprises, represented schematically, a comparator 22 receiving on the one hand on a control voltage input 23, an expected electrical magnitude and on a measurement input 24, electrical signals from the application sampled by interface 11 when component 1 is subjected to the interactions and excitations from laser 14. This part of the device enables the application malfunctions to be identified. The magnitude 23 can be that produced by another board identical to board 6, synchronised with the latter, but which is not subjected to aggression.

In an operational manner, device 17 also comprises another comparator receiving on the one hand on a control voltage input, an expected electrical magnitude of the component and on a measurement input, electrical signals sampled by interface 11 in component 1, when the latter is subjected to the interactions and excitations from laser 14. This optional part of the device enables the faults of component 1 to be identified.

In practice, there can be two comparators: a first, optional comparator, which enables component failure to be measured, and a second comparator which enables a corresponding application failure to be measured. The first comparator can, for example, include a programme to, after being subjected to an aggression, read a memory cell or a registry and verify its content, when this memory cell or this registry are not solicited by the application. The second comparator measures the application's output signals to verify their coherency.

The comparators can be replaced by a routine 25 for measuring the coherency of the signal received by the application and/or by the electronic component 1 with an expected signal. The measurement operation can be static: in this event, only the values of the potentials and currents available on the contacts of interface 11 are tested. It is essentially dynamic in nature. In this event, microprocessor 18 also comprises a clock, which separates certain operations whose running must have a known history, and it is measured to discover whether this history is reproduced in an expected manner or if there are any anomalies.

The programme memory 20 comprises to this effect, a control programme 26 for the laser source 14, its movements XYZ, its power level and its start times. Finally, memory 20 is preferably comprised of a control programme 27 for operating board 6. According to this operation, board 6 runs the application for which it is designed: processing input data received on its connections 3, possibly originating from bus 19, and producing output data, mainly applied to bus 19 or other components 7 and 8 of board 6. The two programmes 26 and 27 can run simultaneously, sequentially or asynchronously. Programme 26 can take into account the phases of programme 27 to opportunely launch the excitations at chosen times.

FIG. 2 shows a first temporal diagram 33 separating the impulses from a timing clock of component 1. This clock can be mounted onto board 1 or connected to bus 19. Preferably, its impulses are managed, or at least taken into account by programme 26. A second temporal diagram 34 shows the temporal distribution of the short duration laser impulses, such as 35, emitted at times 36 to 42, set or not with respect to a specific signal from clock 33. A third temporal diagram 43 shows action phases 44 to 46 of component 1. These action phases correspond to the actions, complex operations, selection, calculation, reformatting, transmission, verification or other actions performed by component 1 within the scope of the application implemented with board 16. A cycle time 47 for the application can thus be defined as the time during which one or several processing phases are performed. According to the invention, it is thus important that dates 36 to 42 are chosen, or at least distributed, with respect to these application cycles, which are different to a cycle 48 of clock 33. It is important that these impulses 35 are distributed during cycle 47, and not when they are placed at a given time with respect to the start 49 or the end 50 of any impulse from clock 33.

In a classic manner, a known method, particularly with microprocessor 18, involves moving the source 14 in the directions XY at the surface of crystal 2 with the use of an actuator 28. By performing this move, the locations of interest can be located, where the interactions between the radiation 14 and the semiconductor component 1 are measured to be the strongest, or even critical. However, this knowledge is insufficient. It does not provide information concerning the depth.

The hole formed by window 16 can be smaller than the width of plate 2 of component 1. The trace of the impact of radiation 15 on the surface of component 1 is naturally less than hole 16, as otherwise, the X and Y scanning of window 16 would be useless.

With such a technique, the areas of interest in component 1 are located in the sense where the areas are the focal points for interactions which are harmful to the correct operation of component 1 and/or of the application. The purpose of the invention is to discover whether the component will, in any place in its structure, be the focal point for a harmful interaction.

In the invention, in order to obtain this result, the laser radiation 15 is focused with the use of a focus device, represented schematically by a lens 29, and a focus depth of a focal point 30 of radiation 15 thus focused is varied with the use of this lens 29. For example, a depth 31 shown here is located underneath interface 2-5. The refractive index of crystal 2, which is different to the refractive index of the air, is naturally taken into account. This is not shown in FIG. 1, where the focused radiation has rectilinear beams 34. According to the invention, for each focus depth, the energy interactions of the radiation on component 1 are measured. The principle of this measurement is as follows.

As soon as the laser source 14 is positioned opposite an area of interest, for a first given focus, for example on interface 2-5, the level of attenuation of the laser energy is adjusted by the controls transmitted to actuator 32 with the use of microprocessor 18 and bus 19, and source 14 is controlled with the use of microprocessor 18 and bus 19, in order to create a laser impulse. The reduction of the level of attenuation of actuator 32 causes an energy increase to the laser. This increase results in an increase in power of the laser positioned in component 1.

In practice, this administration of energy excitations is pulsed (in particular so as to prevent the component from overheating due to continuous illumination). In order to make the measurements realistic, it was discovered that the impulse should be very short, for example lasting approximately one hundred picoseconds or even less, and therefore in all cases, of a duration of less than or equal to one nanosecond.

In addition, preferably, but not as an obligation, the change in power can be performed in steps. From an experimental point of view, the starting point is the highest value of laser energy (power), and this is reduced until the critical value is obtained (however the opposite is also possible: from the lowest value of energy, progressively increasing). For each impulse and at the end of the impulse, the coherency of the signals read in component 1 and at the level of the application with respect to the expected signals is measured. If this coherency is correct, the attenuation is reduced. At a given moment in time, a critical power level is reached, for which, for the first time, the electronic reaction from the application or component 1 is no longer as expected. The value of this critical power level is noted.

Then, the focus of the laser source is changed, for example by moving lens 29 towards component 1 (or possibly by using a variable focal lens), in such a way that the focal point 30 penetrates further into crystal 2. For this other in-depth position of this focal point 30, the operation by increase is reiterated (an operation by reduction can also be performed), and a new critical power value is obtained. By acting in this way, an in-depth mapping and not merely a surface mapping of the malfunction of electronic component 1 can be obtained.

The laser beam is incident by the rear side, on the side of the substrate of component 1. If the laser beam does not penetrate the metallisations, irradiation by the rear side is preferable to reveal all of the sensitive areas. Mounting onto electronic board 6 is therefore fully compatible with the method, and it enables window 16 to be opened.

For a given impulse time, the critical energy level corresponds to a critical power level. If the critical energy curve, also known as the threshold energy, is traced according to the focus depth in the configuration of FIG. 1, it will have an appearance as represented in FIG. 3. Using this curve (researching the minimum value) provides the depth of the sensitive are of collection. Indeed, the critical area is the area where the least power is required from laser 14 in order to disturb the correct operation of component 1.

For one position of interest, the focus of the laser beam is adjusted in such a way as to identify the focus for which the component presents a maximum level of sensitivity with respect to a laser impulse. This maximum level of sensitivity is obtained when the level of laser energy required to cause the failure is minimal. This operation is performed for a position of interest, but can also be repeated systematically for all of the positions of the laser mapping or possibly for positions chosen at random. For example, FIG. 3, for a given position XY, a minimal energy level 51 was found to be required at a depth 52 to cause a failure. At any other depth, a level of laser energy higher than energy level 51 was required. Thus, the minimum of the experimental curve characterising the evolution of the threshold energy according to the focus depth, corresponds to the depth at which the sensitive area is located.

Then, for a level of laser energy higher than this minimum energy level, therefore higher than this energy level 51, the laser beam is moved with respect to the component, in a known or random manner, over all or part of the surface of the latter, over all or part of its depth, for all of part of phases 44 to 46. For a certain number of positions and for times 36 to 42, a laser fire is performed, synchronised or not with respect to a signal 33 and a check is performed on the test system to check whether one or several failures (faults within the component or application malfunctions) have occurred.

A laser must be used, for which the designed material of component 1 is not transparent (by linear or nonlinear absorption mechanism). In the event of linear absorption, the energy level from the photon laser must be higher than the potential barrier at the forbidden band of the semiconductor. For silicon, the wavelength of the laser must be smaller than 1.1 micrometers.

Thus, the minimum value of the experimental curve characterising the evolution of the threshold energy according to the focus depth corresponds to the depth at which the sensitive area is located.

If its properties are well chosen, as well as the particles, a pulsed and focused laser enables the semiconductor constituting the electronic components to be ionised locally and in a transient manner, causing transient or permanent faults in the component running the application. In order to achieve this, the laser must have a wavelength enabling charges to be generated (by linear or nonlinear absorption mechanism) in the material making up the component.

The nonlinear absorption mechanism corresponds to an excitation with several photons. Several photons are absorbed simultaneously by the semiconductor material. The sum of energy from these photons is enough to cause a fault. The advantage of the latter mechanism is that it enables improved spatial resolution, in depth within the component and on the plane of this component. A more precise location of the multiphoton impact thus enables the operation of the application to be characterised in more detail with respect to the aggressions.

For example, in the event of linear absorption in silicon, the wavelength of the laser must be lower than 1.1 µm. The laser is preferably used in single-impulse mode or synchronised with respect to a signal from the component or the application undergoing testing. An optical system is used to focus the laser radiation at the level of the component's active areas. Finally, there is a system on the optical path length of the laser beam, enabling the level of laser energy to be modified. This system has an interface which enables it to be controlled from a computer.

All of the elements can be controlled in order to enable the test to be automated.

The positions and times of the laser fires can be chosen at random to reproduce the impact of the particles from the natural environment or not, or on the contrary, they can be carefully adjusted so as to locate the spatial and temporal positions causing faults to the component and causing the application to malfunction. In addition, in each position, the level of laser energy can be adjusted and the same position tested again until no more faults are measured and/or no further malfunction of the application is observed, which enables a mapping of the sensitivity of the component and associated application to be drawn up.

This procedure can be performed for the component and application for which no mitigation technique has been applied, as well as for the component and application for which a mitigation technique has been applied. Comparing the two measures proves the effect of mitigation. If the application run by the component malfunctions, the mitigation is implemented and the procedure is repeated. This procedure can be performed on an isolated component on a board 6 and on which an application is installed, or on a component 1 included on a board 6, itself included in its actual environment.

Table 1 hereinafter shows the different verification and measurement operations which can be performed according to this method. The symbol Y signifies yes, the symbol N signifies no.

Situation C: A spatial and temporal mapping was drawn up of the failures occurring at the level of the component and application, spatial and temporal locations were identified as responsible for the component and application failures and an exhaustive observation of the modes of failure was performed, the dynamic efficient area of the component was measured (number of failures per laser fire), and the dynamic efficient area of the application was measured (number of failures per laser fire)

Situation D: A spatial mapping was drawn up of the failures occurring at the level of the component—a spatial and temporal mapping was drawn up of the failures occurring at the level of the application, spatial and temporal locations were identified as responsible for the application failures—spatial locations were identified as responsible for the component failures, an exhaustive observation of the modes of failure was performed spatially and an exhaustive observation of the modes of application failure was performed temporally, the dynamic efficient area of the component was measured (number of failures per laser fire), and the dynamic efficient area of the application was measured (number of failures per laser fire)

Situation E: A spatial and temporal mapping was drawn up of the failures occurring at the level of the component—a spatial mapping was drawn up of the application failures, spatial and temporal locations were identified as responsible for the component failures, spatial locations were identified as responsible for the application failures, an exhaustive observation of the modes of failure was performed spatially and a statistic observation temporally, the dynamic efficient area of the component was measured (number of failures per laser fire), and the dynamic efficient area of the application was measured (number of failures per laser fire)

Situation F: A spatial mapping was drawn up of the failures occurring at the level of the component and application, spatial locations were identified as responsible for the component and application failures, an exhaustive observation of the modes of failure was performed spatially and a statistic obser-

TABLE 1

| Operations | A | B | C | D | E | F | G | H | I | J | K | L |
|---|---|---|---|---|---|---|---|---|---|---|---|---|
| Laser fire with sufficient energy | N |   | Y | Y | Y | Y | Y | Y | Y | Y | Y | Y |
| Application failure control - reset if required |   | N | Y | Y | Y | Y | Y | Y | Y | Y | Y | Y |
| Component failure control - reset if required |   |   | Y | Y | Y | Y | Y | Y | Y | Y | Y | N |
| Control and reset of the component or application between each laser fire? |   |   | Y | Y | Y | Y | Y | Y | Y | Y | N | N |
| Mapping (spatial injection of faults controlled at different energy levels) |   |   | Y | Y | Y | Y | N | N | N | N | — | — |
| Spatial injection of faults at random and at different energy levels |   |   | N | N | N | N | Y | Y | Y | Y | — | — |
| Determination of the energy threshold of the application failure |   |   | Y | Y | Y | Y | Y | Y | Y | Y | Y | Y |
| Determination of the energy threshold of the component failure |   |   | Y | Y | Y | Y | Y | Y | Y | Y | Y | N |
| Temporal synchronisation possible with respect to the application? |   |   | Y | Y | N | N | Y | Y | N | N | — | — |
| Temporal synchronisation possible with respect to a signal from the component? |   |   | Y | N | Y | N | Y | N | Y | N | — | — |

According to the results obtained by the test device in reaction to these operations in situations A to L, the conclusions to be drawn with respect to test validity, component validity or validity of the software application tested are as follows.

Situation A: Increase the energy level and restart

Situation B: Not applicable vation temporally, the dynamic efficient area of the component was measured (number of failures per laser fire), and the dynamic efficient area of the application was measured (number of failures per laser fire)

Situation G: A temporal mapping was drawn up of the failures occurring at the level of the component and application, temporal locations were identified as responsible for the component and application failures, an exhaustive observation of the modes of failure was performed temporally and a statistic observation spatially, the dynamic efficient area of the component was measured (number of failures per laser fire), and the dynamic efficient area of the application was measured (number of failures per laser fire)

Situation H: A temporal mapping was drawn up of the failures occurring at the level of the application, temporal locations were identified as responsible for the application failures, an exhaustive observation of the modes of application failure was performed temporally and a statistic observation spatially, the dynamic efficient area of the component was measured (number of failures per laser fire), and the dynamic efficient area of the application was measured (number of failures per laser fire)

Situation I: A temporal mapping was drawn up of the failures occurring at the level of the component, temporal locations were identified as responsible for the component failures, an exhaustive observation of the modes of component failure was performed temporally and a statistic observation spatially, the dynamic efficient area of the component was measured (number of failures per laser fire), and the dynamic efficient area of the application was measured (number of failures per laser fire)

Situation J: A statistic observation of the modes of failure of the component and application was performed both temporally and spatially, similar to that obtained during the tests under a particle accelerator, the dynamic efficient area of the component was measured (number of failures per laser fire), and the dynamic efficient area of the application was measured (number of failures per laser fire), the dynamic efficient area of the component was measured (number of failures per laser fire), and the dynamic efficient area of the application was measured (number of failures per laser fire)

Situation K: Accumulation of failures within the component, multiple errors are not identified, the number of component failures required to cause an application failure was measured according to the time of fire with respect to the application cycle, the static efficient area of the component was measured (total number of failures with respect to the total number of laser fires), and the static efficient area of the application was measured (total number of failures with respect to the total number of laser fires)

Situation L: Accumulation of failures within the component, multiple errors are not identified, the static efficient area of the application was measured (total number of failures with respect to the total number of laser fires)

The invention claimed is:

1. A method for testing a predetermined software application implemented using an electronic circuit board configured to receive input data and provide output data, the circuit board including a main electronic component and set of other components, the electronic circuit board being configured to run the application, the method comprising:
   placing the electronic circuit board in a test installation, the test installation being configured to cause the electronic circuit board to run the software application by applying a clock signal and input data consistent with the software application to the electronic circuit board via an interface and configured to receive output data consistent with the software application from the electronic circuit board via the interface;
   applying pulse laser radiation impulses having respective durations of less than or equal to one nanosecond to the main component while the test installation applies the input data to the electronic circuit board, wherein ones of the pulsed laser radiation pulses are applied at respectively different depths;
   comparing the output data of the electronic circuit board received via the interface to respective expected output data while applying the laser radiation impulses to detect a malfunction of the software application and of the main electronic component;
   determining a spatial and temporal mapping of failures occurring at the level of the component and application for each detected malfunction;
   identifying spatial and temporal locations as responsible for the failures of the component and application;
   observing modes of failure of the component and the application; and
   measuring a dynamic efficient area of the software application and of the component by the number of failures per laser fire to provide a measure of malfunction of the component and the application.

2. A method according to claim 1, wherein
on an application run by a component and which presents malfunctions after a test performed according to the method,
implementing a mitigation by modifying the component or the application, and
reiterating the test steps to verify the efficiency of the mitigation.

3. A method according to claim 1, wherein
a cycle time with respect to a start time for the laser radiation pulses, is a time taken by the component to perform a complex operation.

4. A method according to claim 1, further including
focusing the laser radiation at different depths in the component in order to define a location of interest,
identifying the focus, for which the component presents maximal sensitivity wherein,
the maximal sensitivity is obtained when the level of laser energy required to cause a fault is minimal,
and then, subjecting different places in the component to a level of laser energy higher than the minimal energy level.

5. A method according to claim 1, further including
for a given depth, varying the laser power in steps,
and determining a critical power level of the laser, above which interaction between the laser radiation and the component or application becomes critical.

6. A method according to claim 1, further including
exciting the component by one side of a plate of the component, the one side preferably being opposite a side on which impurity introductions are made, the component being fitted with metallisations on a side of the component opposite to the plate.

7. A method according to claim 1, further including
making a hole in a layer of protection of the component plate, in such a way as to at least reach a semiconductor layer of the component,
the hole having a surface area smaller than a total surface area of the component plate,
the hole having a surface area greater than a surface area of a trace of an impact from the laser radiation on the component.

8. A method according to claim 1, further including
measuring an interaction by comparing an output signal from the component or board to an expected value, or by comparing an action generated by the board to an expected action, and detecting the conditions under which the comparison is no longer compliant with a criteria.

9. A method according to claim 1, wherein the laser source provides a level of photon laser energy that is greater than a value of a forbidden band of a semiconductor from which at least part of the component is made or, if the level of photon energy is lower than the value of the forbidden band of the semiconductor component, a multi-photon absorption system is implemented to provide a multi-photon laser energy that is greater than the value of the forbidden band.

10. A method according to claim 1, wherein the laser source causes simultaneous absorption of several photons in a semiconductor material from which at least part of the component is made.

11. An apparatus for testing a predetermined software application implemented using an electronic circuit board configured to receive input data and provide output data, the circuit board including a main electronic component and set of other components, the electronic circuit board being configured to run the application, the apparatus comprising:

a test installation configured to receive the electronic circuit board and to cause the electronic circuit board to run the software application by applying a clock signal and input data consistent with the software application to the electronic circuit board via an interface and configured to receive output data consistent with the software application from the electronic circuit board via the interface;

means for applying pulse laser radiation impulses having respective durations of less than or equal to one nanosecond to the main component while the test installation applies the input data to the electronic circuit board, wherein ones of the pulsed laser radiation pulses are applied at respectively different depths;

means for comparing the output data of the electronic circuit board received via the interface to respective expected output data while applying the laser radiation impulses to detect a malfunction of the software application and of the main electronic component;

means for determining a spatial and temporal mapping of failures occurring at the level of the component and application for each detected malfunction;

means for identifying spatial and temporal locations as responsible for the failures of the component and application;

means for observing modes of failure of the component and the application; and means for measuring a dynamic efficient area of the software application and of the component by the number of failures per laser fire to provide a measure of malfunction of the component and the application.

* * * * *